US012685053B2

(12) United States Patent
Ishii et al.

(10) Patent No.: US 12,685,053 B2
(45) Date of Patent: Jul. 14, 2026

(54) PLASMA PROCESSING METHOD

(71) Applicant: Hitachi High-Tech Corporation,
Tokyo (JP)

(72) Inventors: Yohei Ishii, Hillsboro, OR (US);
Kathryn Maier, Hillsboro, OR (US);
Lucas Kovatch, Hillsboro, OR (US);
Makoto Miura, Tokyo (JP)

(73) Assignee: Hitachi High-Tech Corporation,
Tokyo (JP)

( * ) Notice: Subject to any disclaimer, the term of this
patent is extended or adjusted under 35
U.S.C. 154(b) by 42 days.

(21) Appl. No.: 18/367,721

(22) Filed: Sep. 13, 2023

(65) Prior Publication Data

US 2025/0087497 A1     Mar. 13, 2025

(51) Int. Cl.
*H10P 50/26*          (2026.01)
*H01J 37/32*          (2006.01)

(52) U.S. Cl.
CPC ........ *H10P 50/267* (2026.01); *H01J 37/3244*
(2013.01); *H01J 2237/334* (2013.01)

(58) Field of Classification Search
None
See application file for complete search history.

(56) References Cited

U.S. PATENT DOCUMENTS

| | | | |
|---|---|---|---|
| 11,282,753 | B2 | 3/2022 | Kibi |
| 2005/0074980 | A1 | 4/2005 | Yang |
| 2005/0238808 | A1 | 10/2005 | Gatineau et al. |

| | | | | |
|---|---|---|---|---|
| 2019/0108982 | A1* | 4/2019 | Yang | H01J 37/321 |
| 2019/0295856 | A1 | 9/2019 | Tahara et al. | |
| 2019/0311915 | A1 | 10/2019 | Nagatomo et al. | |
| 2020/0365468 | A1 | 11/2020 | Kibi | |
| 2022/0068661 | A1 | 3/2022 | Shaw et al. | |
| 2022/0199422 | A1* | 6/2022 | Yang | H01L 21/32136 |
| 2022/0285167 | A1 | 9/2022 | Shaw et al. | |
| 2023/0223273 | A1 | 7/2023 | Shul et al. | |
| 2024/0021435 | A1 | 1/2024 | Fan et al. | |
| 2025/0105020 | A1 | 3/2025 | Imai et al. | |

FOREIGN PATENT DOCUMENTS

| | | | |
|---|---|---|---|
| JP | 2004-259927 A | | 9/2004 |
| JP | 2005-314713 A | | 11/2005 |
| JP | 2007305892 A | * | 11/2007 |
| JP | 2019-169627 A | | 10/2019 |
| JP | 2019-186322 A | | 10/2019 |

(Continued)

OTHER PUBLICATIONS

Office Action mailed Sep. 30, 2025 in Japanese Application No.
2024-114053.

(Continued)

*Primary Examiner* — Stephanie P Duclair
(74) *Attorney, Agent, or Firm* — Miles & Stockbridge,
P.C.

(57) ABSTRACT

A plasma processing method of etching a ruthenium-containing film using a first etching process (S01) and a subsequent second etching process (S02). S02 comprises a first step (S11) where a modified layer is formed on the surface of the ruthenium-containing film using a halogen element-containing plasma, and a following second step (S12) to desorb the modified layer using a plasma generated with an oxygen element-containing gas; S11 and S12 are repeated alternately.

7 Claims, 10 Drawing Sheets

(56)         References Cited

FOREIGN PATENT DOCUMENTS

| KR | 10-2020-0053623 A | 5/2020 |
| KR | 10-2021-0151229 A | 12/2021 |
| TW | 202249058 A | 12/2022 |
| WO | 2019151018 A1 | 8/2019 |
| WO | 2022051045 A1 | 3/2022 |

OTHER PUBLICATIONS

Office Action mailed Jun. 16, 2025 in Taiwanese Application No. 113128354.
Search Report mailed Aug. 23, 2022 in International Application No. PCT/JP2022/023881.
Office Action mailed Jun. 4, 2025 in U.S. Appl. No. 18/279,797.
Office Action mailed Jan. 27, 2026 in Korean Application No. 10-2024-0090997.

* cited by examiner

<u>201</u>

214
213
212
211

<u>202</u>

214
213
212
211

<u>203</u>

214
213
212
211

PLASMA PROCESSING METHOD

TECHNICAL FIELD

The present invention relates to a plasma processing method for a semiconductor substrate.

BACKGROUND ART

With progress of microfabrication of semiconductor devices, there is an increasing demand for processing with fine line widths and high aspect ratios. Copper (Cu) has been widely used as a suitable material for microfabrication in an interconnection process, but with the progress of microfabrication, resistivity of Cu has become a problem, and ruthenium (Ru) has become a candidate material as an alternative to Cu.

PTL 1 discloses a high-definition metal-film etching method, in which a metal such as Ru and/or an oxide film of the metal is etched little by little. The etching method of PTL 1 has a two part process: the first part, in which a metal film is exposed to ions or radicals of halogen atoms without applying an electric field such as a high-frequency bias to adsorb them, and the second part, in which the metal film is exposed to oxygen ions or radicals while a weak electric field such as a high-frequency bias is applied so that the metal film with halogen atoms adsorbed is etched. Since a secondary product is formed on the surface of the metal film by a reaction with the chlorine plasma in the first process, the etching can be advanced even with a small amount of energy in the oxygen plasma during the second process.

CITATION LIST

Patent Literature

PTL 1: Japanese Unexamined Patent Application Publication No. 2007-305892

SUMMARY OF INVENTION

Technical Problem

The finer the structure of a semiconductor device, the more non-negligible the impact of a structure's surface state formed by plasma processing has on performance of a semiconductor device. According to the inventors' study, the surface of the Ru film formed by the method disclosed in PTL 1 has a large roughness. This damage caused by exposure to the oxygen plasma, remains, resulting in deterioration in performance of the semiconductor device. On the other hand, it is necessary to avoid a significant decrease in throughput of the plasma etching process.

An objective of the invention is to provide a plasma processing method, by which a Ru-containing film pattern having a good surface state is formed by plasma etching while reducing throughput of a plasma etching process.

Solution to Problem

One embodiment of the invention is a processing method of plasma etching a ruthenium-containing film on a substrate. The method comprises a first etching process of plasma etching the ruthenium-containing film and a subsequent second etching process of plasma etching the ruthenium-containing film. The second process is further split into two steps in which the first step forms a modified layer on a surface of the ruthenium-containing film using plasma generated with a halogen element-containing gas, and the second step desorbs the modified layer using plasma generated with an oxygen element-containing gas; the first step and the second step repeat alternately.

Advantageous Effects of Invention

The described plasma processing method provides a Ru-containing film pattern with a smooth and minimally damaged surface condition. Other objects and novel features will become apparent from the content of this specification and the accompanying figures.

DESCRIPTION OF EMBODIMENTS

Figure 1:
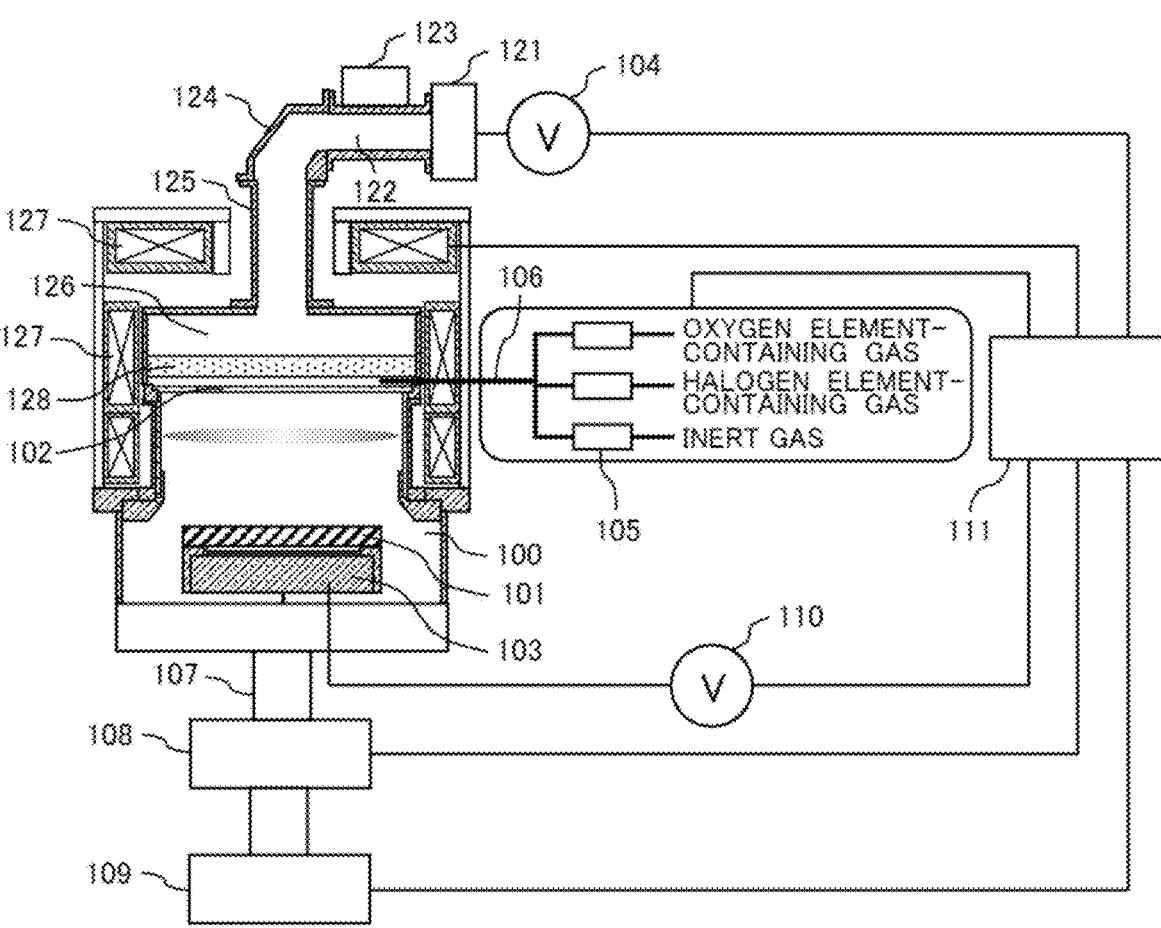
FIG. 1 is a schematic diagram of a plasma processing apparatus.

FIG. 1 shows an exemplary plasma processing apparatus that generates electron cyclotron resonance (ECR)-excited plasma and is used to perform plasma processing in this embodiment. This apparatus uses microwave as an excitation source and generates plasma by applying an external magnetic field.

The plasma processing apparatus has a vacuum container 100 where the plasma is generated and includes therein a sample stage 103 on which a substrate (wafer) 101 to be processed is placed. The sample stage 103 is connected to a substrate-bias high-frequency power supply 110. Direction and/or energy of ions incident on the substrate 101 can be controlled by regulating the substrate bias (high-frequency power) applied. The vacuum container 100 is connected to pump 109 through a pressure control valve 108 and exhaust pipe 107 to adjust and maintain low pressure inside the vacuum container 100 during plasma processing.

A microwave source 121 receives power from a microwave power supply (plasma generation power supply) 104 and generates the microwave. The microwave power generated by the microwave source 121 is then regulated by a microwave matching device 123 and is propagated from a rectangular waveguide 122 through a transducer 124 to a circular waveguide 125 and a cavity chamber 126 that resonates the propagated microwave power.

The cavity chamber 126 is separated from the vacuum container 100 by a partition plate 128. The partition plate 128 is made of a dielectric that transmits the microwave power and maintains a vacuum state inside the vacuum container 100. An electromagnet 127 is provided outside the cavity 126 and vacuum chamber 100 to form a magnetic field inside the cavity 126 and vacuum chamber 100 to generate electron cyclotron resonance.

A shower plate 102 with holes for supplying gas is positioned inside the vacuum container 100, and gas line 106 for supplying process gas is located between the partition plate 128 and the shower plate 102. The gas flow rate is regulated by mass flow controller (MFC) 105 and supplied to the vacuum container 100 through the gas line 106. To attain desired film quality, MFC 105 is ideally installed in each gas system. The gases supplied by each respective gas system are, for example, an oxygen element (O)-containing gas, a halogen element-containing gas, and an inert gas. Although using $O_2$ as the oxygen element (O)-containing gas will be described in the examples later, CO, $CO_2$, $SO_2$, COS, etc. may also be used. In addition, although using $Cl_2$ as the halogen element-containing gas will be described later, HBr, $CF_4$, $SF_6$, $NF_3$, $CHF_3$, etc. may also be used. The inert gas can be used for gas switching and gas uniformity improvement. For example, nitrogen gas and/or a rare gas such as He or Ar can be used.

A control unit 111 controls the microwave power supply 104, the electromagnet 127, the MFC 105, the pressure control valve 108, the pump 109, and the substrate-bias high-frequency power supply 110 to perform plasma processing on the substrate 101.

Figure 2:
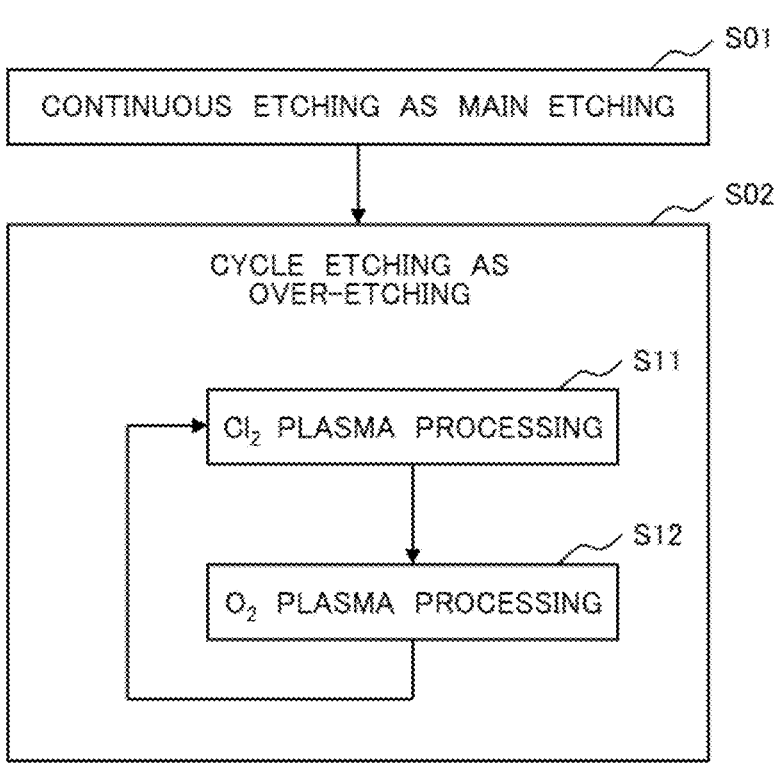
FIG. 2 is a flowchart of plasma processing in the present embodiment.
Figure 3:
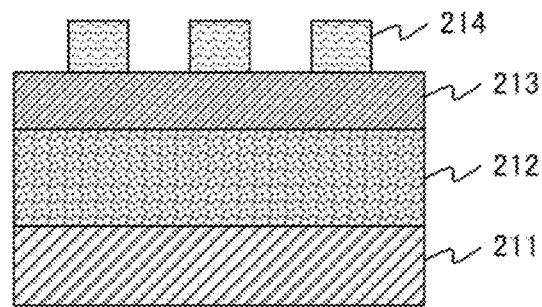
FIG. 3 illustrates a device etched by the plasma processing in this embodiment.
Figure 3:
Figure 3:
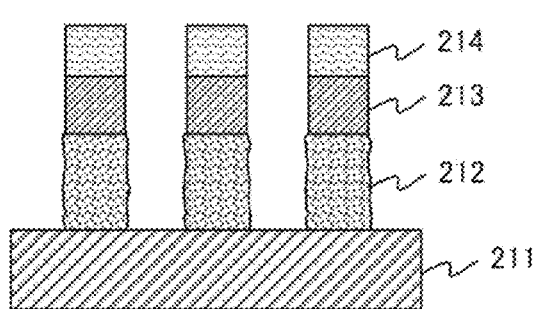
Figure 3:
Figure 3:
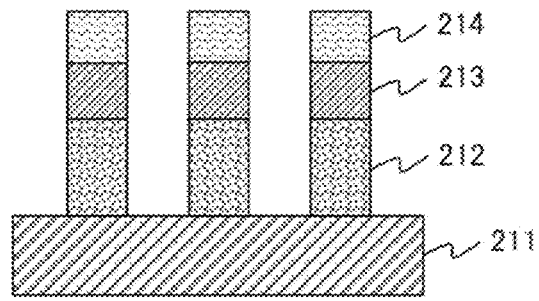

A process flow of this embodiment is described with FIGS. 2 and 3. The sample in FIG. 3 shows an extracted device cross-sectional structure pertaining to an interconnection layer (one layer) of substrate 101. The sample 201 has a layer structure, in which an oxide film 211, a Ru film 212, and a SiN film 213 are stacked in order and has a patterned hard mask 214 on the layer structure. The oxide film 211 is a silicon oxide film ($SiO_2$), and the Ru film 212 is a Ru element-containing film such as a ruthenium film or a ruthenium oxide film. In the process flow of this embodiment, the pattern of the hard mask 214 is transferred to the SiN film 213 and the Ru film 212 by plasma etching the substrate that has a structure similar to sample 201. First, main etching (first etching, S01) is performed on the sample 201. The main etch process is an anisotropic, continuous etching process where etching proceeds according to the pattern of the hard mask 214 and ends when the oxide film 211 is reached. Such continuous etching can improve throughput of the plasma etching. However, at the end of the step S01, as shown as a sample 202 (see FIG. 3), the Ru film 212 has a plasma-etched sidewall with large surface roughness and plasma damage remaining.

Figure 4:
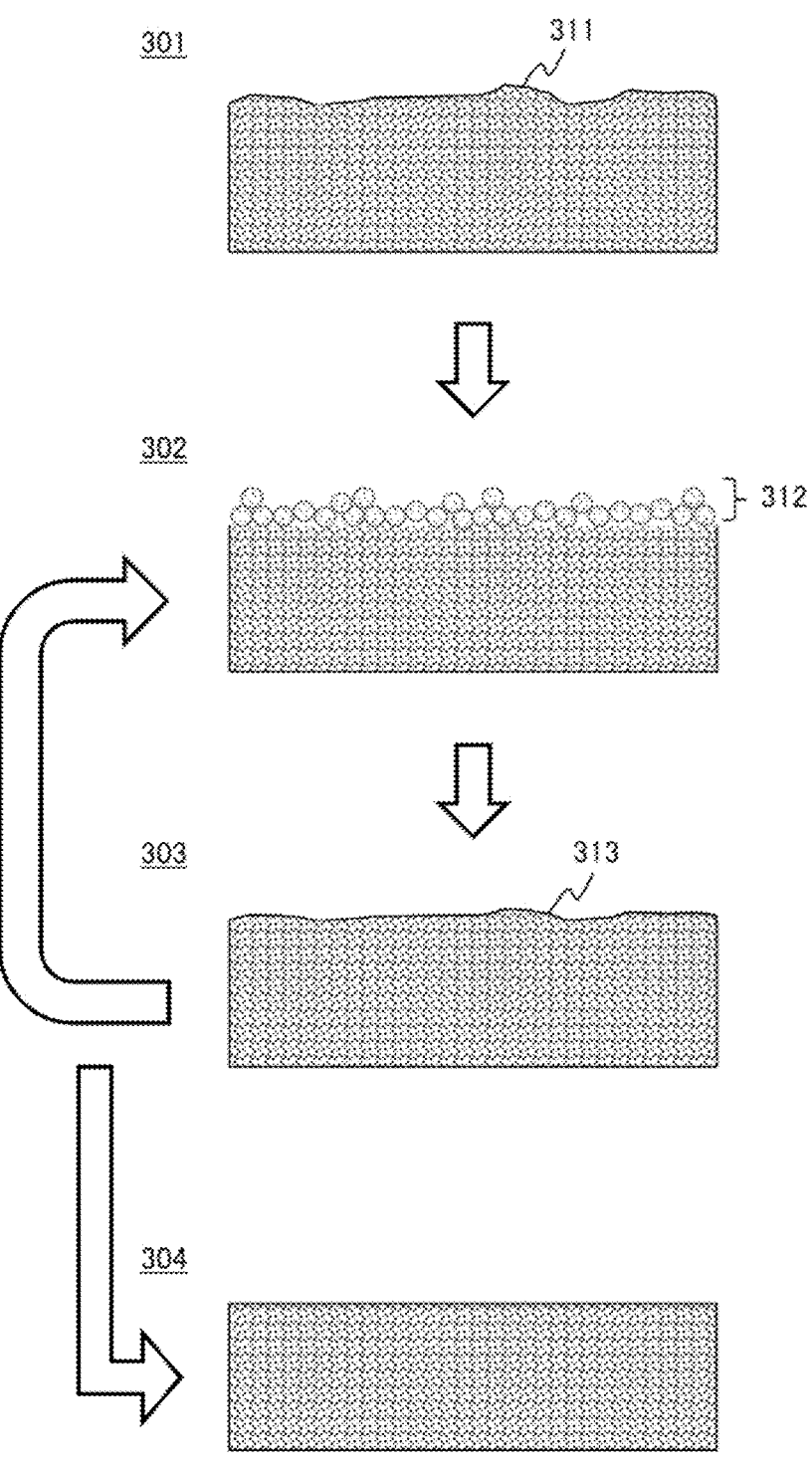
FIG. 4 shows changes in the surface of a Ru film during an over-etching process.

Therefore, in the process flow of this embodiment, over-etching (second etching, S02) is performed on sample 202 following the main etching to remove the surface roughness of the sidewall of the Ru film 212 and the plasma damage on the sidewall surface. The over-etching process is a cyclic etching process where $Cl_2$ plasma processing (S11) and $O_2$ plasma processing (S12) are performed repeatedly. FIG. 4 shows changes in the surface of the Ru film during the over-etching process. In FIG. 4, the Ru film 212 in FIG. 3 is shown with its sidewall surface facing upward. The Ru film 301 shows the surface condition 311 after the step S01, depicting surface roughness and plasma damage.

In the $Cl_2$ plasma processing (S11), plasma is generated while $Cl_2$ is supplied as the halogen element-containing gas from the gas line 106. At this time, low amounts of high-frequency power (about 50 W) from the substrate-bias high-frequency power supply 110 may be applied to substrate 101. However, the high-frequency power is optional in this step. Ru film 302 shows the surface condition after performing $Cl_2$ plasma processing (S11) on the Ru film 301. The $Cl_2$ plasma processing causes the Cl element to adsorb onto and modify the surface of the Ru film. Specifically, the Cl element combines with the Ru element on the surface of film 302, and thus forms a nonvolatile $Ru_xCl_y$ modified layer 312.

In the $O_2$ plasma processing (S12), plasma is generated while $O_2$ is supplied as the oxygen element-containing gas from the gas line 106. At this step, high-frequency power is not applied to substrate 101 to make the surface state of the Ru film as smooth as possible. Ru film 303 shows the surface condition as a result of performing $O_2$ plasma processing (S12) on the Ru film 302. The $O_2$ plasma processing purpose is to desorb the $Ru_xCl_y$ modified layer 312 on the surface of the Ru film. The $O_2$ plasma processing causes the following reaction.

$$Ru_xCl_y + O \rightarrow RuO_2 + O_xCl_y + Cl_2 \rightarrow RuO_4 + O_xCl_y + Cl_2$$

$RuO_4$, which is volatile, desorbs from the Ru film, and etching proceeds. The surface 313 of the Ru film 303 is smoother than the surface 311 of the Ru film 301.

Thus, the etching proceeds to smooth the surface of the Ru film by repeatedly performing the surface modification by the $Cl_2$ plasma processing (S11) and the desorption by the $O_2$ plasma processing (S12). Ru film 304 represents the Ru film in such a state.

The sample at the end of the step S02 corresponds to the sample 203 in FIG. 3. The surface roughness of the Ru film pattern formed by the plasma etching is reduced, and the plasma damage on that surface is also removed.

Figure 5:
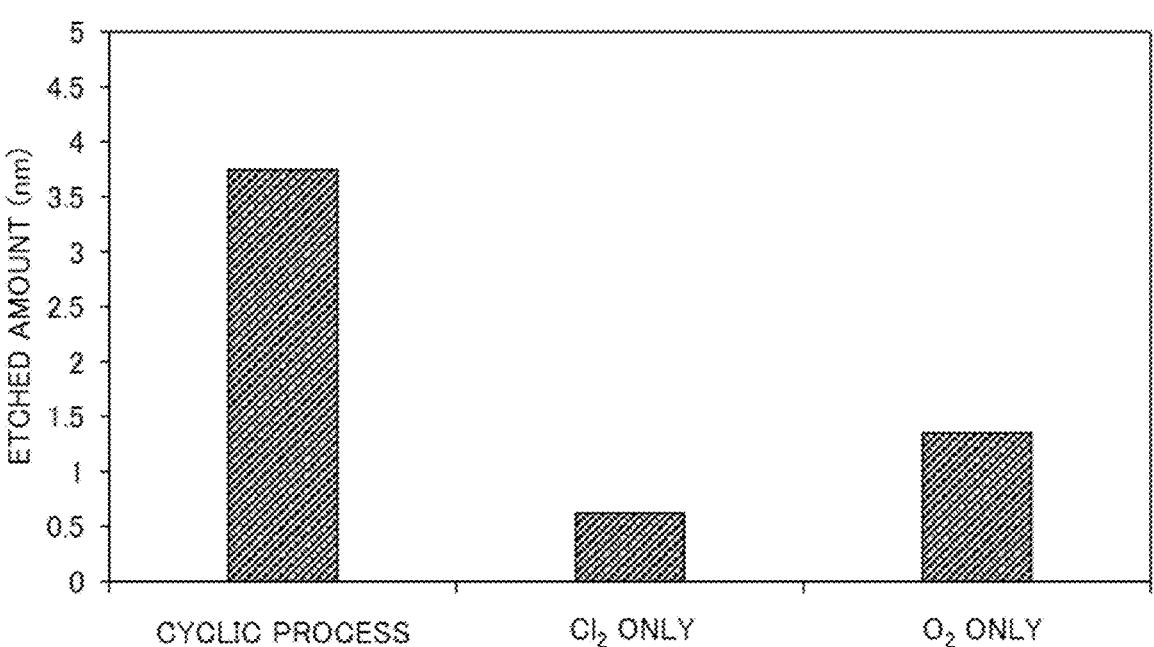
FIG. 5 shows effects of this embodiment.

FIG. 5 shows the etched amount when the $Cl_2$ plasma processing and the $O_2$ plasma processing are each performed separately and the etched amount when the over-etching process S02 is performed as one cycle. It shows that the etched amount for one cycle of the over-etching process is larger than the simple sum of the etched amounts for the respective plasma processing steps. Therefore, the formation of $O_xCl_y$ on the surface of the Ru film in the over-etching process contributes to acceleration of etching.

Figure 6:
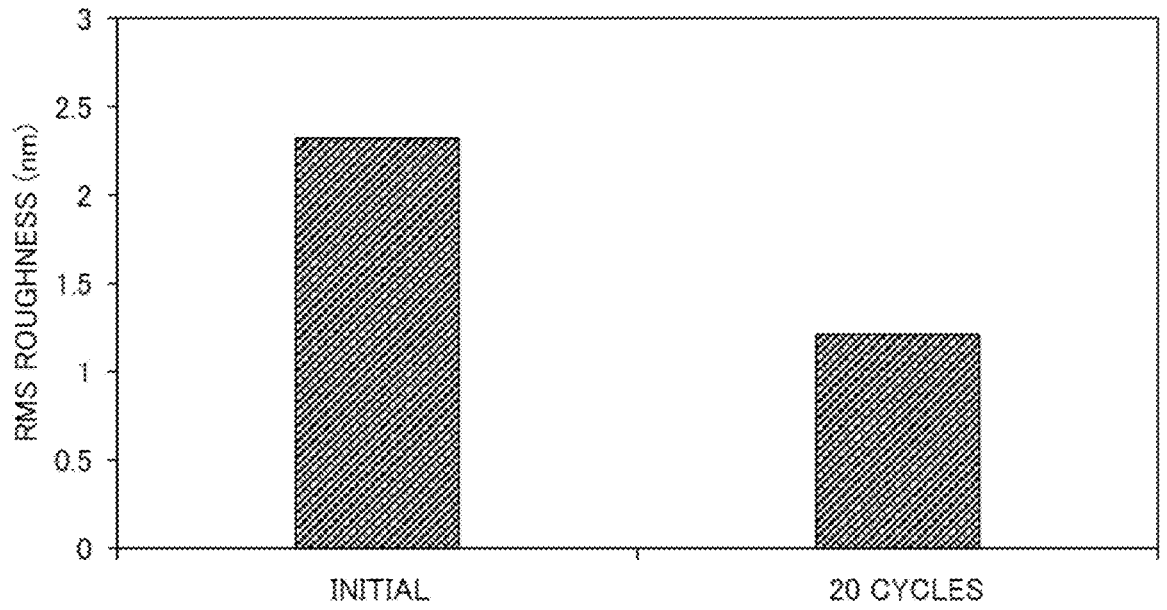
FIG. 6 shows effects of this embodiment.

FIG. 6 shows a change in surface roughness (root mean square roughness: RMS) of the Ru film after 20 cycles of the over-etching process. It shows that 20 cycles of the over-etching process improves the surface roughness by approximately 50% compared to before the over-etch (initial), while increasing the etched amount by approximately 75 nm (3.8 nm/cycle, see FIG. 5).

Figure 7:
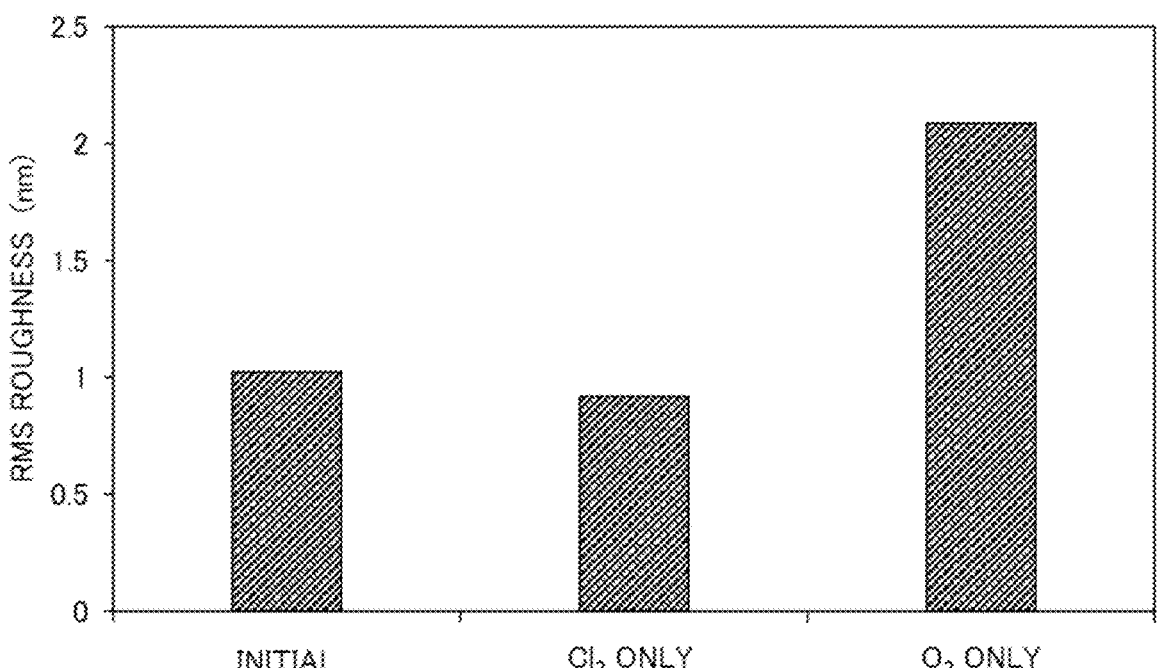
FIG. 7 shows effects of this embodiment.

FIG. 7 shows the change in surface roughness of the Ru film when the $Cl_2$ plasma processing and the $O_2$ plasma processing are each performed separately. It is clear that the surface roughness after the $Cl_2$ plasma processing is almost the same as before the processing (initial), while the surface roughness after the $O_2$ plasma processing is significantly worse than before the processing. In this way, it is possible to prevent deterioration of the surface state due to the $O_2$ plasma processing by starting the over-etching process from the $Cl_2$ plasma processing.

Figure 8:
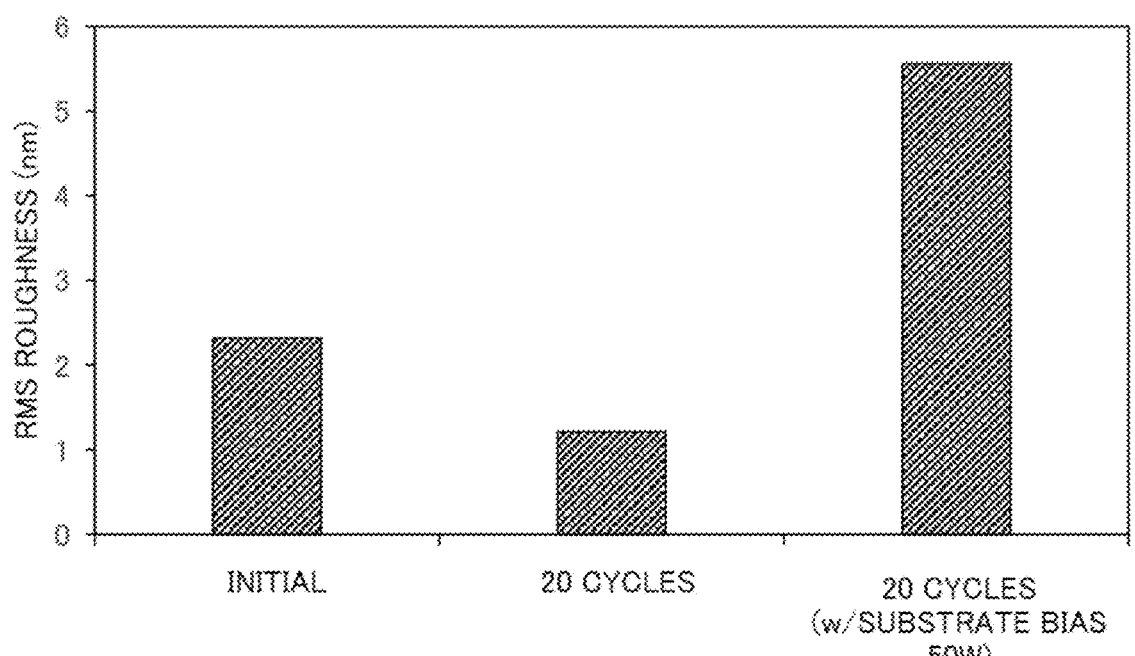
FIG. 8 shows effects of this embodiment.

FIG. 8 shows the surface roughness of the Ru film when 20 cycles of S02 in this embodiment are performed and shows, as a comparative example, the surface roughness of the Ru film when S02 is performed while high-frequency power (50 W) is applied to the substrate during the $O_2$ plasma processing S12. It can be seen that the surface roughness is significantly worsened in the comparative example. Since high-energy oxygen ions are incident on the Ru film due to application of the high-frequency power to the substrate, the surface roughness is worsened.

Examples of processing a semiconductor device using the plasma processing of this embodiment are described below.

First Example

In the first example, Ru line interconnection processing is performed. The process of the Ru line interconnection processing is as shown in FIG. 3. In the main etching process (S01), a mixture of $Cl_2$ as the halogen element-containing gas and $O_2$ as the oxygen element-containing gas is supplied from the gas line 106 while being diluted with Ar gas as the inert gas to generate plasma. Although continuous etching is desirably performed in the main etching process to increase throughput of the plasma etching, cyclic etching with the $Cl_2$ plasma processing and the $O_2$ plasma processing may also be performed. In the cyclic etch case, high-frequency power is also applied to the substrate during the $O_2$ plasma processing to achieve an anisotropic etching process.

Figure 9:
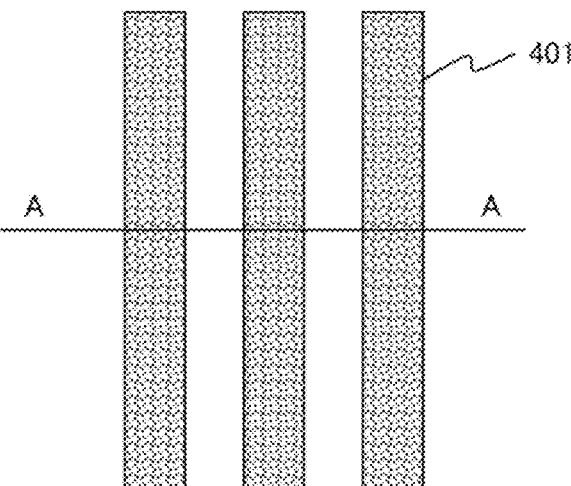
FIG. 9 is a top view of Ru line interconnections formed in the first example.

FIG. 9 is a top view of Ru line interconnections formed in a first example. The view of FIG. 3 corresponds to the cross-sectional view along the A-A line in FIG. 9. Ru line interconnections 401 are arranged at a pitch of approximately 20 nm. Applying the processing of the first example makes it possible to remove the Ru residues from the sidewalls and smooth portions of the Ru line interconnections subjected to plasma processing. Accordingly, the line edge roughness (LER)/line width roughness (LWR) of the interconnections can be improved.

Second Example

Figure 10:
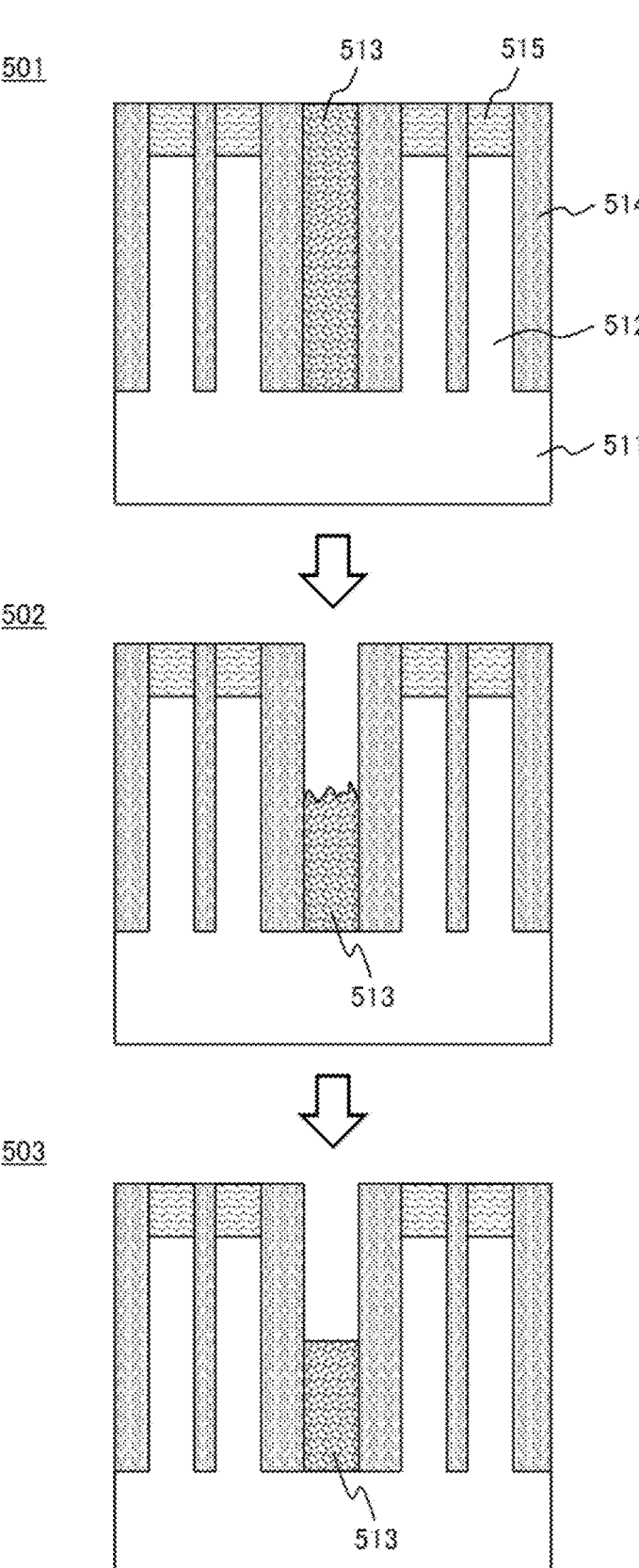
FIG. 10 illustrates a device processing etching method in a second example.

In the second example, Ru interconnection processing (Buried Power Rail) is performed, and a case is described where Ru-buried interconnections are formed on a Si substrate patterned with a fin structure. FIG. 10 shows a description of the process. In a sample 501, a Ru film 513 is formed on a Si substrate 511 with fins 512, and each fin 512 is insulated from the Ru film 513 by an oxide film 514. A hard mask 515 remains on the fins 512.

First, main etching (S01) is performed on the sample 501. Step S01 is a selective, anisotropic etching process, in which etching does not proceed in any material other than the Ru film 513 due to the oxide film 514 and the hard mask 515, and the plasma etching proceeds only in the vertical direction of the Ru film 513. At the end of step S01, as shown as a sample 502, the Ru film 513 has a plasma-etched top surface with large surface roughness and plasma damage remaining.

Following the main etching, over-etching (S02) is performed on the sample 502 to remove the surface roughness of the upper surface of the Ru film 513 and the plasma damage on the sidewall surface. The profile at the end of the step S02 corresponds to the sample 503. The Ru film 513 top surface roughness is reduced, and the plasma damage on the surface is also removed. As a result, Ru-buried interconnections with smooth top surfaces can be produced.

In the second example, although continuous etching is ideally performed in the main etching process as in the first example, cyclic etching may also be performed.

Third Example

Figure 11:
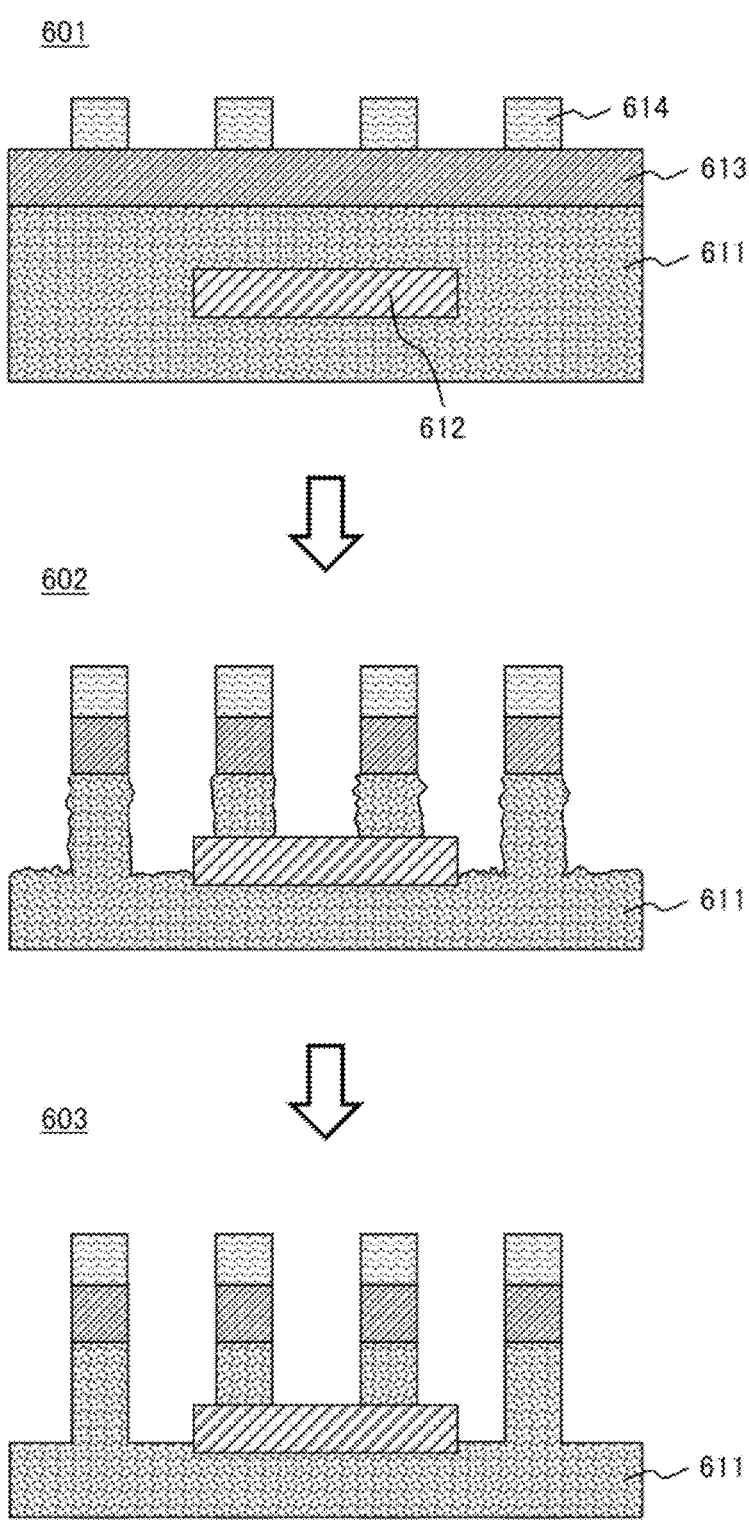
FIG. 11 illustrates a device processing etching method in a third example.
Figure 12:
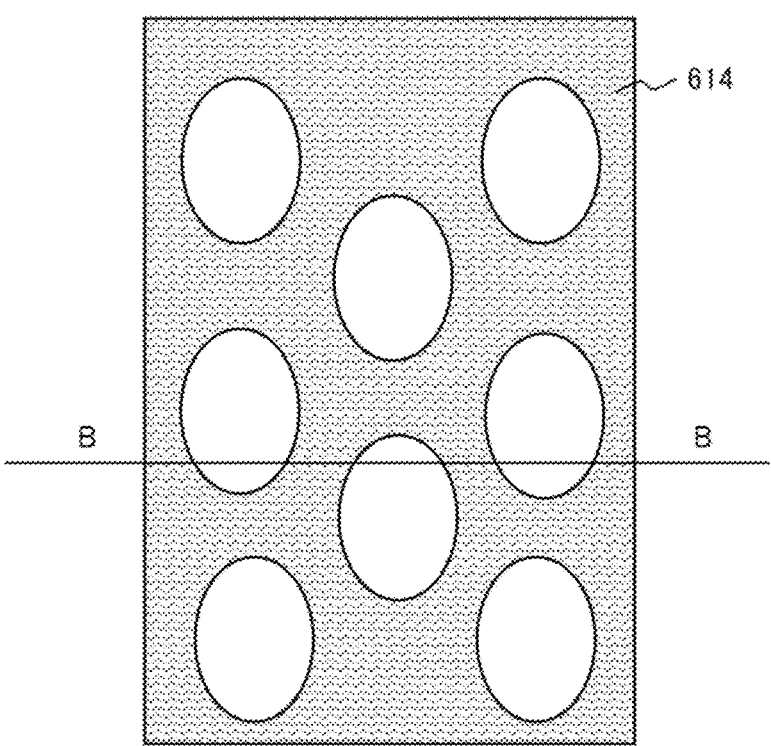
FIG. 12 is a top view of a mask pattern in a third example.

In a third example shown in FIG. 11, hole processing (via processing) is performed. The sample 601 has a layered structure in which Ru film 611 and SiN film 613 are stacked, and patterned hard mask 614 is formed on the layered structure. An insulating film (oxide film) 612 is formed so as to be buried in the Ru film 611. FIG. 12 shows a top view of the structure in FIG. 11, and FIG. 11 corresponds to a cross sectional view along the B-B line in FIG. 12.

First, the main etching (S01) is performed on the sample 601. The main etching process is the same as in the first example. Step S01 is ideally continuous etching to increase throughput of the plasma etching process, but it may also be cyclic etching. In the cyclic case, high-frequency power is applied to the substrate in the $O_2$ plasma processing to achieve the anisotropic etching process. At the end of the step S01, as shown as a sample 602, the Ru film 611 has plasma etched surfaces; i.e., the bottom surface and side surfaces of the via hole, and each of these surfaces has large surface roughness and plasma damage remaining.

Following the main etching, over-etching (S02) is performed on the sample 602 to remove the surface roughness and plasma damage of the etched surface of the Ru film 611. Sample 603 shows the profile at the end of the step S02 with reduced surface roughness of the Ru film 611 and the plasma damage removed. As a result, a via hole with smooth bottom and side surfaces can be formed.

The invention is not limited to the embodiment described above and includes various modifications; the embodiment and modifications are described in detail to make the invention easier to understand, and the invention is not necessarily limited to only the described configurations. In addition, various configurations of embodiments or modifications can be replaced by or added to another embodiment or modification. Further, part of a configuration of each embodiment or modification can be subjected to addition, deletion, or replacement with another configuration. For example, although ECR excited plasma processing apparatus has been exemplified as the plasma processing apparatus in this embodiment, the invention is not limited to this; the plasma processing apparatus may be an inductively coupled plasma (ICP) processing apparatus or a capacitively coupled plasma (CCP) processing apparatus. A radical etching chamber with an ion shielding plate in the vacuum container 100 may also be used.

REFERENCE SIGNS LIST

100: Vacuum container, 101: Substrate to be processed, 102: Shower plate, 103: Sample stage, 104: Microwave power supply, 105: Mass flow controller, 106: Gas line, 107: Exhaust pipe, 108: Pressure control valve, 109: pump, 110: substrate-bias high-frequency power supply, 111: control unit, 121: microwave source, 122: rectangular waveguide, 123: microwave matching device, 124: transducer, 125: circular waveguide, 126: Cavity chamber, 127: Electromagnet, 128: Partition plate, 201, 202, 203, 501, 502, 503, 601, 602, 603: Sample, 211: Oxide film, 212, 301, 302, 303, 304: Ru film, 213: SiN film, 214: hard mask, 311, 313: surface, 312: $Ru_xCl_y$ modified layer, 401: Ru line interconnection, 511: Si substrate, 512: fin, 513: Ru film, 514: oxide film, 515: hard mask, 611: Ru film, 612: insulating film (oxide film), 613: SiN film, 614: hard mask

The invention claimed is:

1. A processing method of performing plasma etching on a ruthenium-containing film on a substrate, the method comprising:

a first etching process of plasma etching the ruthenium-containing film, and a subsequent second etching process of plasma etching the ruthenium-containing film, wherein the second etching process comprises a first step that forms a modified layer on a surface of the ruthenium-containing film using plasma generated with a halogen element-containing gas, and a second step of desorbing the modified layer using plasma generated with an oxygen element-containing gas, and wherein the first step and second step of the second etching process alternately repeat, and wherein no radio frequency power is supplied to a sample stage where the substrate is placed during an entirety of the second step of the second etching process.

2. The method according to claim 1, wherein the plasma in the first etching process is generated with a mixture of a halogen element-containing gas and an oxygen element-containing gas.

3. The method according to claim 1, wherein the first etching process has a third step that forms a modified layer on a surface of the ruthenium-containing film using plasma generated with a halogen element-containing gas and a fourth step of desorbing the modified layer using plasma generated with an oxygen element-containing gas; the third step and the fourth step repeat alternately.

4. The method according to claim 1, wherein the second etching process starts from the first step.

5. The method according to claim 1, wherein the halogen element-containing gas is chlorine gas, and the oxygen element-containing gas is oxygen gas.

6. The method according to claim 1, wherein the ruthenium-containing film is a ruthenium film, the ruthenium film is formed over a silicon oxide film, and a silicon nitride film is formed over the ruthenium film.

7. The method according to claim 1, wherein the substrate to be processed has a Fin FET structure, and the ruthenium-containing film is buried between fins.

\* \* \* \* \*